United States Patent [19]
Frank et al.

[11] Patent Number: 6,118,338
[45] Date of Patent: Sep. 12, 2000

[54] LOW NOISE AMPLIFIER CIRCUIT WITH AN ISOLATING SWITCH TOPOLOGY

[75] Inventors: Michael Louis Frank, Los Gatos; Henrik Morkner, Palo Alto, both of Calif.

[73] Assignee: Agilent Technologies, Palo Alto, Calif.

[21] Appl. No.: 09/447,617

[22] Filed: Nov. 23, 1999

[51] Int. Cl.$^7$ .............................. H03F 1/14; H03F 1/02; H03F 1/36
[52] U.S. Cl. ................................ 330/51; 330/9; 330/109
[58] Field of Search .................. 330/51, 9, 110, 330/151, 277, 109, 294

[56] References Cited

U.S. PATENT DOCUMENTS

| | | | |
|---|---|---|---|
| 5,206,603 | 4/1993 | Kilian | 330/294 |
| 5,796,300 | 8/1998 | Morgan | 330/9 |
| 6,025,752 | 2/2000 | Zhou et al. | 330/51 |

OTHER PUBLICATIONS

Ray Moroney, Kevin Harrington, Wayne Struble, Brian Khabbaz, Mike Murphy, A High Performance Switched–LNA IC for CDMA Handset Receiver Applications, 1998 *IEEE Radio Frequency Integrated Circuits Symposium*, p. 43–46.

*Primary Examiner*—Robert Pascal
*Assistant Examiner*—Patricia T. Nguyen

[57] ABSTRACT

An amplifier/switch circuit includes a first circuit input, a second circuit input, a circuit output, an amplifier, a switching circuit and a DC blocking capacitor. The amplifier has an amplifier control input, a first amplifier output and a second amplifier output. The amplifier control input is connected to the first circuit input. The first amplifier output is connected to the second circuit input. The second amplifier output is connected to the circuit output. A switching circuit has a switch control input, a switch input and a switch output. The switch control input is connected to the circuit output. The control input is connected to the second circuit input. The DC blocking capacitor is connected between the amplifier control input of the first transistor and the switch input.

12 Claims, 1 Drawing Sheet

LOW NOISE AMPLIFIER CIRCUIT WITH AN ISOLATING SWITCH TOPOLOGY

RELATED APPLICATION

The subject matter of the present patent application is related to the subject matter set out by the same inventors in a co-pending patent application Ser. No. 09/390,807, filed on Sep. 7, 1999 for AMPLIFIER CIRCUIT WITH A SWITCH BYPASS.

BACKGROUND

The present invention concerns circuits used for communication systems and pertains specifically to a circuit that includes an amplifier and a bypass switch useful for low power devices that utilize microwave signals.

Modern digital wireless systems, such as those used in cellular phones and local area networks (LANs) utilize signals with a frequency typically in the range of 0.5 gigahertz (GHz) to 6.0 GHz.

For strong transmission signals, for example when there is a relatively short transmission distance, it is often advantageous to use a switch or series of switches to bypass a microwave amplifier in order to conserve power. The microwave amplifier, while important to achieve high dynamic range for weak transmission signals, may be unnecessary for strong transmission signals. Providing a bypass of the microwave amplifier allows the system gain to be lowered when the input signal is strong.

In the prior art, to provide for the bypass of a microwave amplifier, switch components are mounted on a printed circuit board. The switch components route the signal to the amplifier to perform the basic amplification function or to the output. Each switch component is, for example, a mechanical type switch, a solid state field-effect transistor (FET) switch or multiple diodes functioning as a switch. A typical topology of an amplifier with a bypass switch includes three switches. A switch is used to bypass the amplifier. A switch connected to the input of the amplifier and a switch connected to the output of the amplifier are used to isolate the amplifier when the bypass switch is turned on and the amplifier is being bypassed.

There are numerous disadvantages of the above-described prior art. Each switch and the amplifier require separate control and bias lines, complicating both layout and switch control. Numerous external components are required, adding both cost and space requirements. Since mechanical switches require 15V or more (handsets provide 2.7V), diodes must be used for switches, requiring significant current draw in the switch state. This current mitigates against the advantage of switching out the amplifier. And the series switches will reduce the performance of the amplifier.

An FET switch can be integrated into the same Integrated Circuit (IC) as the FET amplifier. For example, Ray Moroney, Kevin Harrington, Wayne Struble, Brian Khabbaz, Mike Murphy, *A High Performance Switched-LNA IC for CDMA Handset Receiver Applications,* 1998 IEEE Radio Frequency Integrated Circuits Symposium, p. 43–46, shows an integrated Gallium Arsenide (GaAs) FET solution where a switch function is integrated with an amplifier. This earlier implementation differs from the claimed by numerous points. The disclosed amplifier/switch (AS) uses only a series mode switch, limiting the gain of the amplifier. The disclosed circuit requires several blocking capacitors, increasing die size and cost.

Further, in the AS disclosed by Ray Moroney et al., when the switch is engaged, the input is connected to the output with only the on resistance of the switch in between. This state presents a good match. In order to present the same impedance in both the amplifier and the switch state, the amplifier state must also have a good match. To accomplish this match, the amplifier must be significantly fed-back. This feedback reduces the gain and increases the Noise Figure of the amplifier. This change in performance makes the AS incapable for the premiere slot in a receiver.

SUMMARY OF THE INVENTION

In accordance with the preferred embodiment of the present invention, an amplifier/switch circuit includes a first circuit input, a second circuit input, a circuit output, an amplifier, a switching circuit and a DC blocking capacitor. The amplifier has an amplifier control input, a first amplifier output and a second amplifier output. The amplifier control input is connected to the first circuit input. The first amplifier output is connected to the second circuit input. The second amplifier output is connected to the circuit output. A switching circuit has a switch control input, a switch input, a switch output and an RC circuit connected between the switch input and the switch output. The switch control input is connected to the circuit output. The control input is connected to the second circuit input. The DC blocking capacitor is connected between the amplifier control input of the first transistor and the switch input.

In the preferred embodiment, a resistance is connected between the second circuit input and the circuit output. A feedback resistance is connected between the second amplifier output of the first transistor and the input of the switching circuit. For example, the switching circuit comprises two transistors connected together with the RC circuit in a series-shunt-series configuration.

Using the present invention, only three terminals are required to implement an amplifier/switch circuit. The first circuit input operates to receive a high frequency signal and provides a DC reference. The second circuit input serves as a high frequency ground, and as a DC control node to place the amplifier/switch circuit in a through mode. The amplifier/switch circuit places the amplified signal on the circuit output. The DC power supply is also placed on the circuit output.

When the amplifier/switch is biased on at the output and when there is a low resistance path to ground placed at the second input, amplifier/switch is in the gain mode, the amplifier/switch circuit amplifies the signal from the first circuit input to the circuit output. In this state, amplifier/switch draws current according to the size of the resistor in the ground path. When the amplifier/switch is biased on at the output and when there is a very high resistance path to ground placed at the second input, the amplifier/switch is in the switch mode. In this state, the amplifier/switch circuit routes the signal from the first circuit input to the circuit output through the switch network. In this state, the amplifier/switch draws very little current.

The disclosed embodiment of the present invention offers several advantages over the use of several discrete components to duplicate this function. The primary advantages are small size, low cost, ease of use, ease of implementation and zero current draw during through mode operation.

The disclosed embodiment of the present invention also is advantageous over the integrated GaAs FET solution discussed above in the Background section. For example, a series-shunt-series combination of FET/series-shunt RC circuit/FET overcome several potential radio frequency (RF) problems in the integrated GaAs FET solution discussed above. The series-shunt-series combination also provides improved isolation resulting in greater circuit stability over a wide frequency range.

Often in a radio, the input amplifier is located between two elements with uncontrolled impedance, such as two filters, or an antenna and a filter. Simple switching around the amplifier would connect these high impedance elements, resulting in very poor transfer of power and large uncertainty of gain. Embedding a lossy circuit in the switch allows for these high impedance elements to be connected without the resulting uncertainty. The series—shunt RC network embedded in the switch network accomplishes this.

Additionally, the input amplifier is typically very far from impedance matched to the elements on either side. This is a consequence of minimizing the noise contribution by this amplifier. The matching is done externally, using various well-documented networks. The input network transforms the circuit impedance from that required by the first element (either an antenna or a filter) to that required by the amplifier. The output network transforms the circuit impedance from that required by the amplifier to that required by the second element (typically a filter). If this input amplifier has a switch around state, then in the switch mode the tuning networks are connected together. The switch itself must present an input impedance and an output impedance sufficiently similar to the amplifier to prevent a mismatch due to the matching networks in place to match the amplifier.

DESCRIPTION OF THE PREFERRED EMBODIMENT

Figure 1:
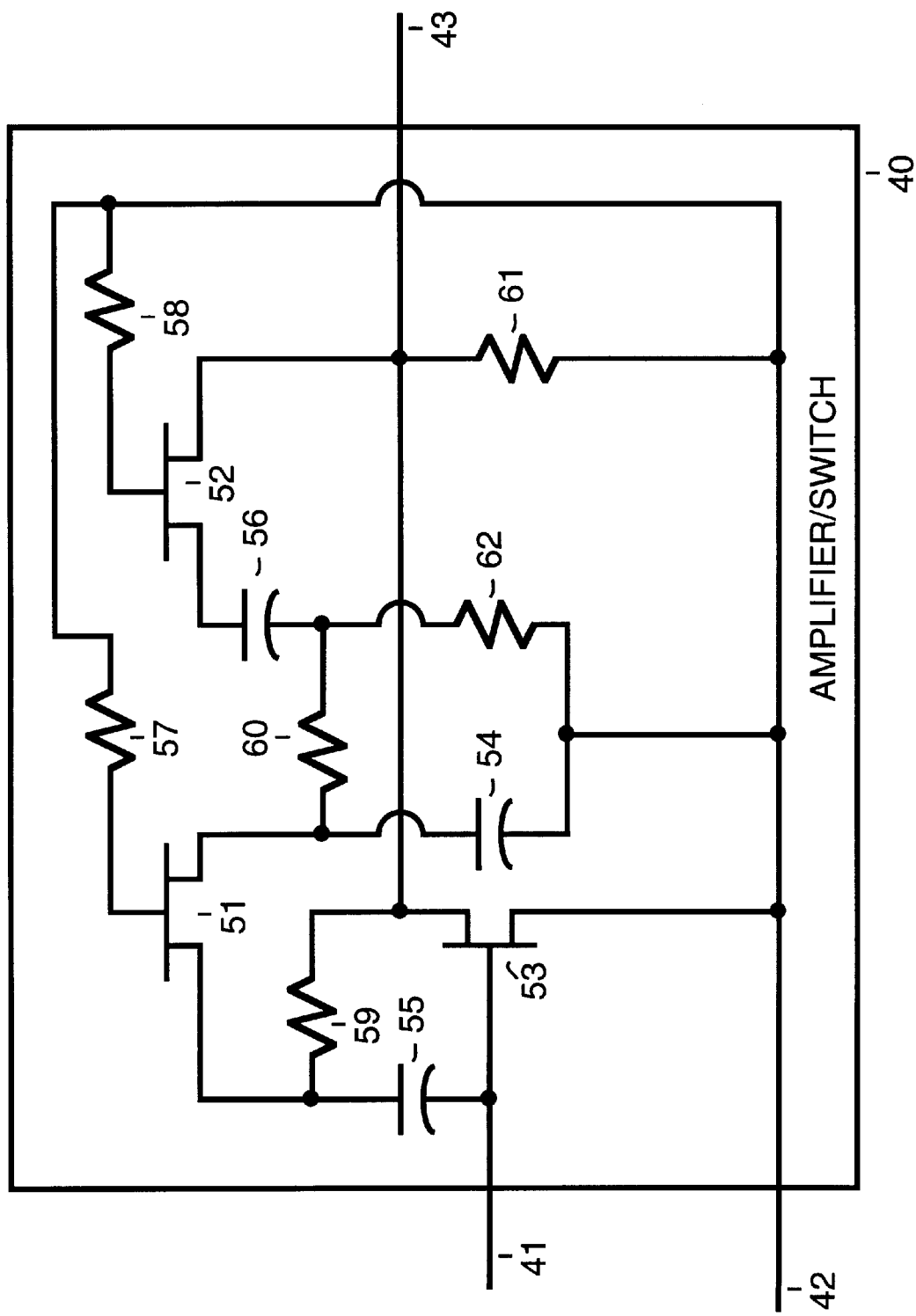
FIG. 1 is a schematic of a circuit of an amplifier circuit with a bypass switch in accordance with a preferred embodiment of the present invention.

FIG. 1 is a schematic of an amplifier/switch circuit 40 that is an amplifier that includes a switch bypass. On a circuit input 41 is placed a radio frequency signal. A DC component (Vr) on Circuit input 41 is DC biased at, for example, 0 volts. A ground input 42 functions as a ground voltage for AC signals and has a DC component (Vc) that serves as a DC control voltage. When the DC component (Vc) of ground input 42 is in the on state (e.g., at 0 volts), amplifier/switch circuit 40 is in a gain mode. When the DC component (Vc) of ground input 42 is in the off state (e.g., at 3 volts), amplifier/switch circuit 40 is in an amplifier through mode. A DC component (Vd) of a circuit output 43 is biased, for example, at 3 volts. When the amplifier is in gain mode, amplifier/switch circuit 40 places an amplified radio frequency (RF) signal on circuit output 43.

Amplifier/switch circuit 40 includes a field-effect transistor (FET) 51, an FET 52, an FET 53, a capacitor 54, a feedback capacitor 55, a capacitor 56, a resistor 57, a resistor 58, a feedback resistor 59, a resistor 60 and a resistor 61, connected as shown in FIG. 1.

Amplifier/switch circuit 40 provides good performance in gain mode, and the amplification is switched easily and efficiently out when not needed. When amplifier/switch circuit 40 is powered up (e.g., when the DC component (Vc) of ground input 42 is at 0 volts), amplifier/switch circuit 40 amplifies the AC signal from circuit input 41 to circuit output 43. When amplifier/switch circuit 40 is powered down (e.g., Vc is at 3 volts) amplifier/switch circuit 40 goes automatically to zero current and routes signals from circuit input 41 through the switch network consisting of FET 51, resistor 60, capacitor 56 and FET 52 to circuit output 43.

There are two states of interest in the switch amplifier. The first state is when input 42 is connected through a low value resistor to ground. The second state is when input 42 is disconnected from ground.

In the first state, when the input 42 is brought to ground, the switch amplifier is in the gain mode and draws current. The signal is routed through the amplifier FET 53, and is amplified accordingly. In this state, the switch FET 51 and switch FET 52 are in the high impedance mode, and do not allow significant signal through, and present a very high impedance, and so do not contribute to the circuit characteristics.

FET 51 and FET 52 are made high impedance by a combination of resistors 57,58, 59 and 61. Resistors 59 and 61 supply the bias voltage at output 43 to both FET 51 and FET 52. Resistors 57 and 58 connect the gates of FETs 51 and 52 to the control input 42. When control input 42 is brought to ground, the gates of FETs 51 and 52 are also at ground. This results in a voltage difference across the FETs 51 and 52 sufficient to set them into the high impedance state, causing the switch path to open.

The feedback, consisting of a capacitor 55 and a resistor 59, is utilized for two functions. As a feedback path, the capacitor functions only to stop the voltage at the drain node of FET 53 from showing up at the gate of FET 53. The resistor provides the actual feedback signal, and is designed simply to make the amplifier more stable. In this implementation, the feedback is very light specifically to minimize the effect on the noise contribution. The second function of the feedback is to deliver the bias voltage available at the output 43 to switch FET 51. Thus both switch FET 51 and switch FET 52 are biased identically.

In the second state, when the input 42 is switched to high impedance, the switch amplifier is in the through mode and draws no current. The amplifier FET 53 no longer has a path for the bias current, and so is now high impedance and has no effect on the impedance of the switch amplifier. The loss in the amplifier FET 53 is large, so there is insignificant signal flow through it. The signal is routed through FET 51, now in the low resistance state, shunted by capacitor 54, through resistor 60, shunted by resistor 62, through capacitor 56, and through FET 52, now in the low resistance state. This network presents similar impedance to that presented by the amplifier 53 when in the gain mode. In this state, the amplifier presents a very high impedance and is not contributing to the circuit impedance.

The network consisting of capacitor 54, resistor 60, capacitor 56 and resistor 62 is designed for two purposes. First, when this network is switched in as in the second state, it presents the same impedance that the amplifier presents when in the first state. This allows for the same impedance transforming networks to be used on the input 41 and output 43. Secondly, the poorly matched source connected to the input of the switch amplifier (either antenna or filter) and the poorly matched load (filter) cannot be connected with so little loss that the gain uncertainty is too high. The network has sufficient loss to sufficiently reduce this uncertainty.

It is not sufficient to simply make the loss in this state very high. This would decrease the gain uncertainty, but would make the switch state less useful, requiring the amplifier state to be enabled more often.

FET 51 and FET 52 are made low impedance by a combination of resistors 57,58, 59 and 61. Resistors 59 and 61 supply the bias voltage at output 43 to both FET 51 and FET 52. Resistors 57 and 58 connect the gates of FETs 51 and 52 to the control input 42. When control input 42 is brought to high impedance resistor 61, connected between the output 43 at the bias voltage and control input 42, pulls the control input 42 to the bias voltage level. The gates of FETs 51 and 52 are now at the same voltage as their respective sources. This 0 volt state results in FETs 51 and 52 biasing at the low impedance state, causing the switch path to short.

FET 53 is used during the gain mode to provide all the gain in the amplifier. FET 51 and FET 52 are used at zero bias (e.g., when Vc is at 3 volts) as voltage controlled resistors (basically switches).

During the gain mode, Vc is at 0 volts and the DC component (Vd) on circuit output 43 is biased at 3 volts. This voltage difference is high enough to put FET 53 in the saturated FET region. Depending upon the semiconductor technology, voltage differential Vc and Vd necessary to place FET 53 in the saturated FET region can vary significantly but is usually 1.0 volts or higher.

Also in the gain mode, the DC component (Vr) on circuit input 41 is at or near zero volts. Vc can be adjusted from Vr−Vc=0.0 volts to Vr−Vc=Pinch-off Voltage. The Pinch-off Voltage is the gate to source voltage of FET 53 required to deplete the semiconductive region of FET 53 so that less than 10% of the Idss current will flow from drain to source of FET 53 from a given drain-to-source voltage. This value when FET 53 is a GaAs FET is usually on the order of 0.5 volts.

In the gain mode, the source lead of FET 53 is tied to circuit input (RF ground) 42. In the gain mode, FET 53 provides gain from circuit input 41 (connected to the gate of FET 53) to circuit output 43 (connected to the drain of FET 53) in a traditional common source mode FET amplifier. Feedback resistor 59 and feedback capacitor 55 are used to temper the gain and provide input/output matching to acceptable system levels for usage.

In the preferred embodiment of the present invention, FET 51 is, for example, a 600 micron depletion mode FET. FET 52 is, for example, a 600 micron depletion mode FET. FET 53 is, for example, a 385 micron gain FET. Capacitor 54 is, for example, a 0.7 picofarad (pF) capacitor. Capacitor 55 is, for example, a 2.3 picofarad (pF) DC blocking capacitor. Capacitor 56 is, for example, a 1.0 picofarad (pF) capacitor. Resistor 57 is, for example a 1 kilohm resistance. Resistor 58 is, for example a 1 kilohm resistance. Resistor 59 is, for example, a 1.35 kilohm feedback resistance. Resistor 60 is, for example a 40 ohm resistance. Resistor 61 is, for example a 40 kilohm DC resistance. Resistor 62 is, for example a 600 ohm resistance.

The foregoing discussion discloses and describes merely exemplary methods and embodiments of the present invention. As will be understood by those familiar with the art, the invention may be embodied in other specific forms without departing from the spirit or essential characteristics thereof. Accordingly, the disclosure of the present invention is intended to be illustrative, but not limiting, of the scope of the invention, which is set forth in the following claims.

We claim:

1. An amplifier/switch circuit comprising:
    a first circuit input;
    a second circuit input;
    a circuit output;
    a first transistor having a gate, a source and a drain, the gate being connected to the first circuit input, the source being connected to the second circuit input and the drain being connected to the circuit output;
    a second transistor having a gate, a source and a drain;
    a third transistor having a gate, a source and a drain, the drain of the third transistor being connected to the circuit output;
    an resistance/capacitance (RC) circuit having a first input, a second input and a third input, a first input of the RC circuit being coupled to the source of the second transistor, the second input being connected to the source of the third transistor and the third input being connected to the second circuit input;
    a first capacitance being connected between the gate of the first transistor and the drain of the second transistor;
    a first resistance being connected between the gate of the second transistor and the second circuit input; and,
    a second resistance being connected between the gate of the third transistor and the second circuit input.

2. An amplifier/switch circuit as in claim 1, additionally comprising:
    a third resistance connected between the drain of the first transistor and a drain of the second transistor.

3. An amplifier/switch circuit as in claim 1, wherein the RC circuit comprises:
    a second capacitance connected between the source of the third transistor and the second input;
    a third capacitance having a first end connected to the source of the third transistor, and having a second end;
    a third resistance connected between the second end of the third capacitance and the source of the second transistor; and,
    a fourth resistance connected between the second end of the third capacitance and the second input.

4. An amplifier/switch circuit as in claim 1, additionally comprising:
    a third resistance connected between the second circuit input and the circuit output.

5. An amplifier/switch circuit as in claim 4, wherein the RC circuit comprises:
    a second capacitance connected between the source of the third transistor and the second input;
    a third capacitance having a first end connected to the source of the third transistor, and having a second end;
    a fourth resistance connected between the second end of the third capacitance and the source of the second transistor; and,
    a fourth resistance connected between the second end of the third capacitance and the second input.

6. An amplifier/switch circuit as in claim 5, wherein the first transistor, the second transistor and the third transistor are all field-effect transistors.

7. An amplifier/switch circuit as in claim 1, wherein the first transistor, the second transistor and the third transistor are all field-effect transistors.

8. An amplifier/switch circuit comprising:
    a first circuit input;
    a second circuit input;
    a circuit output;
    an amplifier having an amplifier control input, a first amplifier output and a second amplifier output, the amplifier control input being connected to the first circuit input, the first amplifier output being connected to the second circuit input and the second amplifier output being connected to the circuit output;
    a switching circuit having a control input, a switch input, a switch output, and a resistance/capacitance (RC)

circuit being connected between the switch input and the switch output, the switch output being connected to the circuit output and the switch control input being connected to the second circuit input; and, a first capacitance being connected between the amplifier control input of the first transistor and the switch input.

9. An amplifier/switch circuit as in claim 8, additionally comprising:

a feedback resistance connected between the second amplifier output of the amplifier and the input of the switching circuit.

10. An amplifier/switch circuit as in claim 8, additionally comprising:

a resistance connected between the second circuit input and the circuit output.

11. An amplifier/switch circuit as in claim 8, wherein the amplifier is a field-effect transistor.

12. An amplifier/switch circuit as in claim 8, wherein the switching circuit comprises two transistors connected together with the RC circuit in a series-shunt-series configuration.

* * * * *